United States Patent [19]

Tokuda

[11] Patent Number: 5,097,306
[45] Date of Patent: Mar. 17, 1992

[54] METHOD OF TRISTABLE SELECTIVE LIGHT DETECTION WITH PIN DIODE

[75] Inventor: Yasunori Tokuda, Itami, Japan

[73] Assignee: Mitsubishi Denki Kabushiki Kaisha, Japan

[21] Appl. No.: 577,546

[22] Filed: Sep. 5, 1990

[30] Foreign Application Priority Data

Sep. 6, 1989 [JP] Japan .................... 1-232211
Sep. 6, 1989 [JP] Japan .................... 1-232212

[51] Int. Cl.$^5$ .......................................... H01L 27/14
[52] U.S. Cl. ................................. 357/30; 357/16; 357/4; 357/19
[58] Field of Search .................... 357/30, 16, 4, 19

[56] References Cited

U.S. PATENT DOCUMENTS 4,833,511  5/1989  Sugimoto ..................... 357/19

FOREIGN PATENT DOCUMENTS 63-133581  6/1988  Japan ......................... 357/30 E

OTHER PUBLICATIONS

Tokuda et al., "Dual-Wavelength Multiple Quantum Well N-I-P-In Photodetector Using an Optically Bistable Abrupt Absorption Edge", Appl. Phys. Lett. 56(3), 15 Jan. 1990, pp. 227–228.
Scifres et al., "Wavelength Demultiplexing Detector", Xerox Disclosure Journal, vol. 11, No. 3, May/Jun. 1986, pp. 141–143.
Tokuda et al., "Anomalous Excitation-Intensity Dependence of Photoluminescence Properties of an Asymmetric Coupler Quantum Well Structure", J. Appl. Phys. 65(5), Mar. 1989, pp. 2168–2170.
Larsson et al., "High-Speed Dual Wavelength Demultiplexing and Detection in a Monolithic Superlattice P-I-N Waveguide Detector Array", Appl. Phys. Lett. 49(5), 4 Aug. 1986, pp. 233–235.
Miller et al., "Novel Hybrid Optically Bistable Switch: The Quantum Well Self-Electro-Optic Effect Device", Appl. Phys. Lett. 45(1), 1 Jul. 1984, pp. 13–15.
Islam et al., "Electroabsorption in GaAs/AlGaAs Coupled Quantum Well Waveguides", Appl. Phys. Lett. 50(16), 20 Apr. 1987, pp. 1098–1100.
Wood et al., "Wavelength-Selective Voltage-Tunable Photodetector Made from Multiple Quantum Wells", Appl. Phys. Lett., 47(3), 1 Aug. 1985, pp. 190–192.
Tokuda et al., "Novel Spectral Response of a Coupled Quantum Well Photodiode", Appl. Phys. Lett., 56(22), 28 May 1990, pp. 2166–2168.
Tokuda et al., "Self-Electro-Optic Effect Based on Anticrossing of Electronic Transitions in a Coupled Quantum Well Structure", Appl. Phys. Lett. 56(2), 8 Jan. 1990, pp. 166–167.
"Light Wavelength Changes State of Photoelectric Device", Nikkei High Tech Report, vol. IV, No. 14, 1989, p. 2, no author.
Tokuda et al., "Self-Deformed and Hysteretic Photocurrent Spectra of Quantum Wells with a Load Resistor", Applied Physics Letters, vol. 54, No. 23, 1989, pp. 2324–2326.
Tokuda et al., "Incident Wavelength Dependence of Photocurrent Bistability by External Bias Voltage Control in a Quantum Well p-i-n Diode", Applied Physics Letters, vol. 55, No. 8, 1989, pp. 711–712.
Tokuda et al., "Novel Spectral Response of a Coupled Quantum Well Photodiode", Applied Physics Letters 56(22), May 28, 1990, pp. 2166–2168.

Primary Examiner—William Mintel
Attorney, Agent, or Firm—Leydig, Voit & Mayer

[57] ABSTRACT

A method of wavelength selective detection of light is achieved using p-i-n type diode and an external resistor connected in series to the diode and applying a reverse bias voltage to said p-i-n type diode through the external resistor. Two bistable wavelength ranges are obtained in the photocurrent spectrum, and the wavelength selective light detection is achieved with an asymmetric coupled quantum well structure. A p-i-n type optical element having multiply stable responses includes a coupled quantum well structure i layer producing the anti-crossing phenomenon in response to varying electric fields. The structure includes relatively thick and relatively thin quantum well layers separated by and coupled through a relatively thin barrier layer.

3 Claims, 9 Drawing Sheets

Vex = V1

Vex = V2

METHOD OF TRISTABLE SELECTIVE LIGHT DETECTION WITH PIN DIODE

APPLICABLE FIELD IN THE INDUSTRY

The present invention relates to method for high sensitivity detection of light at a particular wavelength range, and to a light detecting element having multiple stabilities.

BACKGROUND OF THE INVENTION

A light detection method utilizing a quantum well with wavelength selectivity is recited in, for example, Appl. Phys. Lett. Vol. 47, No. 3, (1985), pp. 190 to 192. The method is based on the principle which will be described.

The quantum well structure exhibits exciton absorption at room temperature and the absorption characteristics thereof are sharp.

FIG. 4 shows photocurrent spectra in case where various reverse bias voltages are applied to the quantum well structure. In FIG. 4, the relation of the reverse bias voltages $V_0$, $V_1$, and $V_2$ is $V_0 < V_1 < V_2$.

As shown in FIG. 4, when a reverse bias voltage is applied to a quantum well structure, the absorption peak of incident light in the quantum well layer shifts toward the longer wavelength side because of the quantum confined Stark effect. Accordingly, an external electric field which is applied to the structure shifts the absorption peak to the wavelength to be detected, so that the light detection can be performed with high wavelength selectivity.

Furthermore, the incident light can be resolved into wavelengths $\lambda_1$ and $\lambda_2$ as shown in FIG. 4 utilizing the wavelength selectivity of the quantum well structure.

FIG. 5 is a diagram showing a construction of Self-electro-optic effect element and an external circuit driving the same, which is recited in, for example, Appl. Phys. Lett., Vol. 45, No. 1 (1984) pp. 13 to 15.

In FIG. 5, reference numeral 51 designates a GaAs-/AlGaAs multi-quantum well region which is between undoped AlGaAs layers 52. A p type AlGaAs layer 53 and an n type AlGaAs layer 54 are disposed sandwiching the undoped layers 52. This p-i-n structure is disposed on an n type GaAs substrate 55 having an aperture in the central portion. An electrode 56 is produced on a rear surface of the substrate 55 and on the p type AlGaAs layer 53. An aperture for incident light is provided on the electrode 56 on the p type AlGaAs layer 53. An external power supply 57 and a resistor 58 are connected in series between the electrodes 56 as an external circuit.

FIG. 12 shows photocurrent spectra for three applied voltages ($V_0 < V_1 < V_2$) when the external resistor 58 is not connected ($R=0\Omega$). FIG. 13 shows photocurrent response against applied voltage at the wavelength $\lambda_1$. The quantum well structure generally has an absorption peak that shifts toward the longer wavelength side, as shown in FIG. 12, with an increase in the external applied voltage Vex, as described above.

Next, a description will be given of the operation.

When the light signal of the wavelength $\lambda$ and intensity Pin is input from the aperture of the electrode 56, the photocurrent flows in accordance with the absorption characteristics of the element including the quantum well structure. The characteristics in a case where the external resistor 58 is not connected to the element are as those shown in FIGS. 12 and 13. On the other hand, when the external resistor 58 is connected to the element, a voltage drop IR arises induced by the photocurrent I, modulates the voltage applied to the element. Thus, also the photocurrent I is again modulated.

The load characteristics are represented by the following formula:

$$I = \frac{C}{PinR}(Vex - V) \qquad (1)$$

where C is a constant.

The intersection between the light response curve of FIG. 13 and the straight line represented by the formula (1) results in a solution. The load characteristics for two incident light powers $P_1$ and $P_2$ ($P_1 < P_2$) are shown by dotted straight lines in FIG. 13, and the response characteristic of this element (incident light power-photocurrent characteristic) is as shown in FIG. 14, resulting in a bistable property in a range between $P_1$ and $P_2$.

Similarly, the bistable property can be obtained in the characteristics of the photocurrent against the applied voltage $V_{ex}$, the external resistor R, and the wavelength $\lambda$.

The above-described prior art light detection method using a quantum well structure having wavelength selectivity utilizes the absorption spectrum and has a problem in its resolution.

Furthermore, the hybrid type optical bistable element of FIG. 5 takes only two stable states in accordance with external parameters such as light input, applied voltage, external resistor, and wavelength.

SUMMARY OF THE INVENTION

It is an object of the present invention to provide a method for detecting light which has quite high resolution, selectively detecting light at a particular wavelength range and electrically controlling the width of the wavelength range.

It is another object of the present invention to provide an optical multi-stable element selecting more than three stable points in accordance with the external parameters.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, an external resistor is connected in series to a p-i-n type diode having a quantum well structure in the i region so as to obtain a bistable wavelength photocurrent characteristic, and the light detection with high wavelength selectivity is performed utilizing the steep absorption edges thereof and the high sensitivity response region between the absorption edges. Therefore, this light detection method has quite high wavelength resolution. Furthermore, light of a particular wavelength range can be selectively detected and further the width of the wavelength can be electrically controlled.

According to a second aspect of the present invention, an optical multi-stable element includes a combined quantum well structure in which a thick well and a thin well are provided separated by a thin barrier as the i layer of the p-i-n structure and utilizes the anti-reverse crossing phenomenon of the optical absorption transition which is induced by changing the electric field. This coupled quantum well induces the anti-crossing phenomenon, thereby providing two peaks in the voltage-photocurrent characteristic. Therefore, the tri-stable property can be easily obtained by connecting a load resistor in series.

DETAILED DESCRIPTION OF THE EMBODIMENT

An embodiment of the present invention will be described in detail with reference to the drawings.

Figure 1:
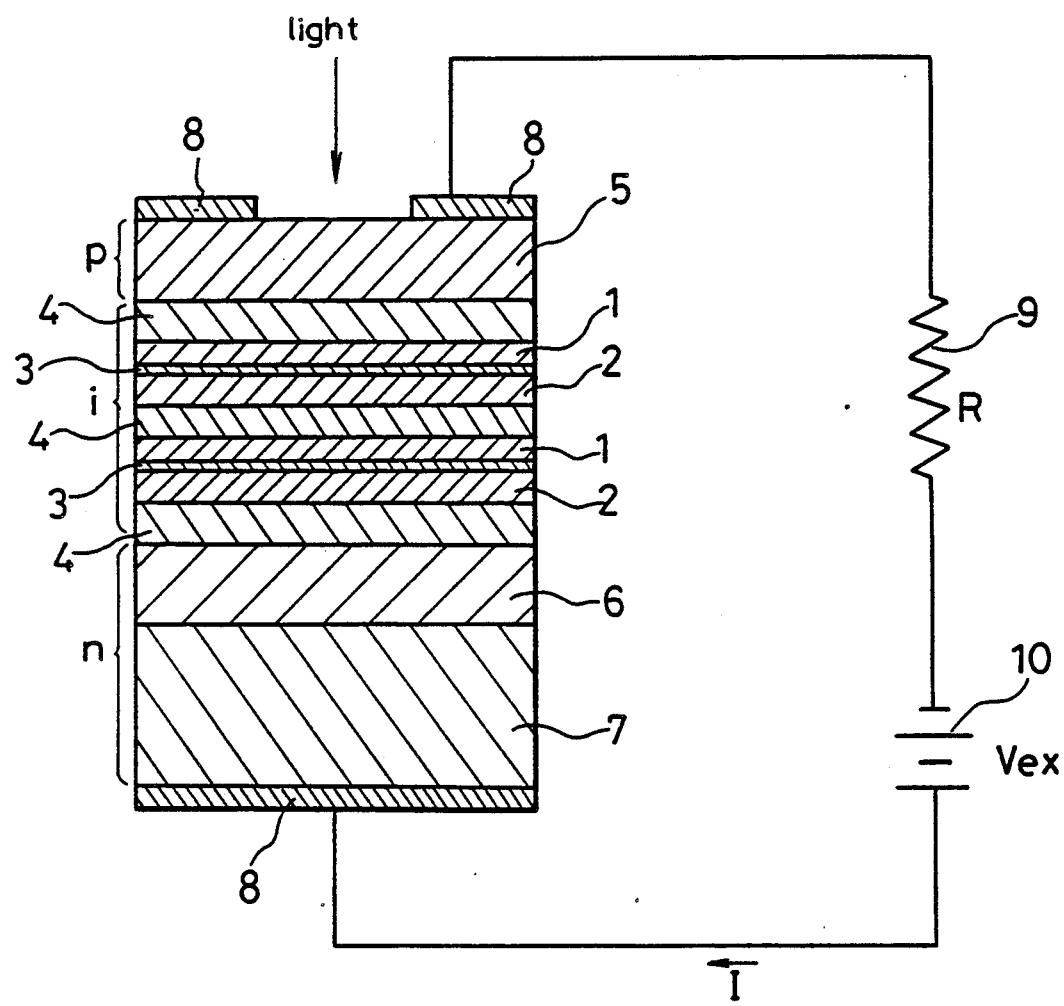
FIG. 1 is a diagram showing the construction of a light detection element in accordance with a first embodiment of the present invention.

FIG. 1 is a diagram showing a construction of a photodetector utilized in a method for detecting light in accordance with a first embodiment of the present invention. In FIG. 1, reference numerals 1 and 2 designate GaAs quantum well layers. An AlAs layer 3 is sandwiched between the GaAs quantum well layers 1 and 2. Both of the two laminated structures of layers 1, 3, and 2 are disposed between a total of three undoped AlGaAs layers 4. A p type AlGaAs layer 5 and an n type AlGaAs layer 6 are disposed on the upper and lower surface of this structure, respectively. An n type GaAs substrate 7 is provided at the rear surface of the layer 6. Electrodes 8 are produced on opposite surfaces of the element. As shown in FIG. 1, a resistor R9 and the power supply voltage $V_{ex}$ 10 are connected in series to this element.

A description will be given of the operation.

When a light signal is input to the element, a photocurrent flows in accordance with the absorption characteristics of the element including the quantum well structure. Since this photocurrent I induces a voltage drop IR at the resistor R9, the voltage applied to the element V becomes $V_{ex}$-IR. Herein, when the absorption spectrum is shifted by the electric field which is applied thereto, the photocurrent I varies by itself, and this load characteristic can be represented as follows:

$$I = \frac{1}{R}(V_{ex} - V) \quad (2)$$

Figure 2:
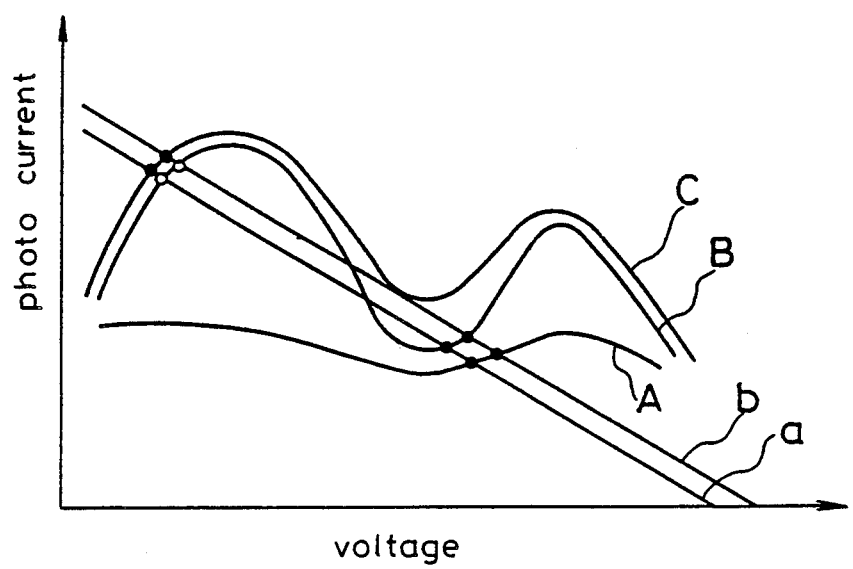
FIG. 2 is a diagram showing the photocurrent-voltage characteristics (A, B, C) and the load characteristics (a, b) when a resistor is not connected to the element of FIG. 1.

Now suppose that the relation between the applied voltage and the photocurrent when the resistor 9 is not connected to the element varies from the solid curved line A to the solid curved line B, from B to C, from C to B, and from B to A with the wavelength of incident light that becomes successively shorter as shown in the schematic view of FIG. 2. Furthermore, suppose that the minimum values between the first and second peaks of photocurrent becomes a maximum at a particular wavelength, and further that, the peak of the photocurrent at lower voltage side becomes lower as the incident light is shifting from that wavelength.

Such characteristics can be obtained through the anti-crossing phenomenon of quantum levels in the asymmetric coupled quantum well structure of FIG. 1 in which, for example, the thickness of the GaAs quantum well 1 is 80 angstroms, the thickness of the GaAs quantum well 2 is 100 angstroms, and the thickness of the AlAs layer 3 is 8 angstroms.

Figure 3:
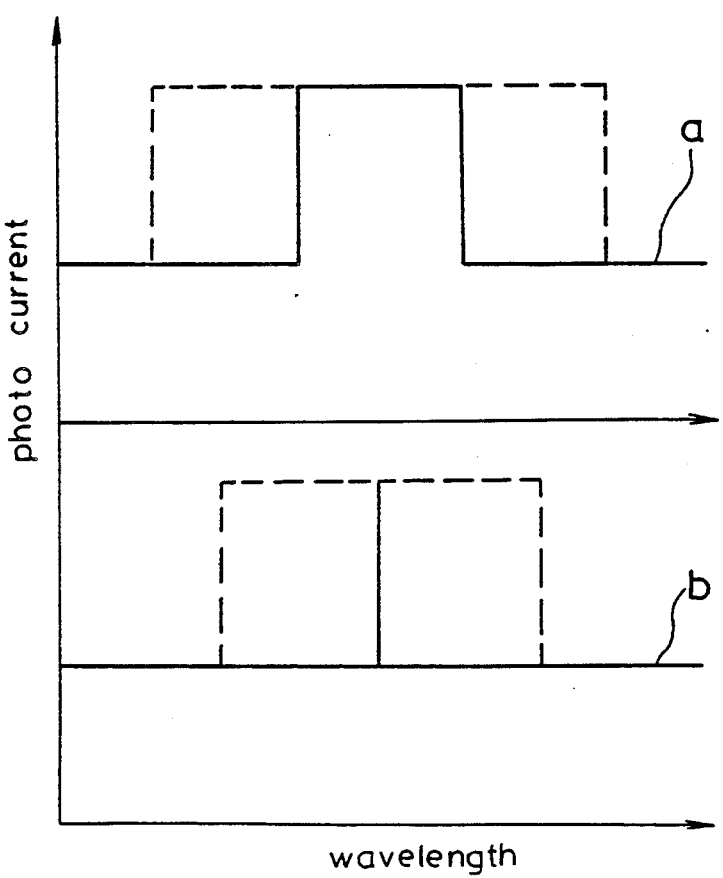
FIG. 3 is a diagram showing the photocurrent spectrum against the load lines a and b shown in FIG. 2.
Figure 4:
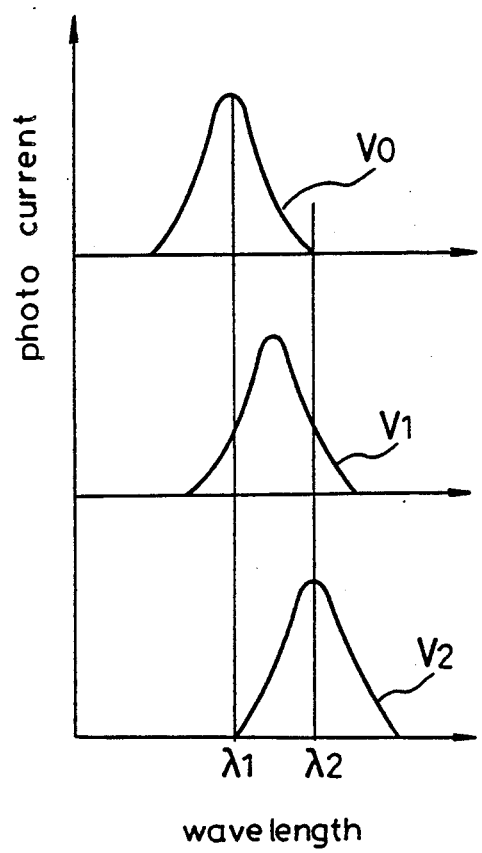
FIG. 4 is a diagram showing the voltage dependency of the photocurrent spectrum in a prior art quantum well p-i-n type diode.

FIG. 3 is a schematic view showing the photocurrent spectra (characteristics of photocurrent against wavelength) which are obtained for the two load lines (a) and (b) of FIG. 2. In FIG. 3, a broken line and a solid line each represent a stable state. In the spectrum of the line (a) of FIG. 3, the rectangular center part of the solid line is a high photocurrent response region and this is sandwiched by two bistable wavelength regions on both sides thereof. When monochromatic light in the bistable wavelength region is input to the element, the element exhibits a low current level response represented by the lower solid line.

In other words, the response of the element to the monochromatic signal is represented by the solid line of FIG. 3. Here, when the external applied voltage $V_{ex}$ is increased, since the load line shifts from (a) to (b) as seen from the formula (2), the wavelength range of high current level at the center portion of real line in FIG. 3 is reduced, and it can be reduced, in principle, to the infinitesimal width range shown in FIG. 3.

As described above, the element having characteristics such as in FIG. 2 can be used as a photo detector element with wavelength selectivity showing high sensitivity to a light signal within a particular wavelength range. Furthermore, the high sensitive wavelength range can be controlled by an external applied voltage.

In the above-described embodiment, the quantum well comprises an asymmetric coupled quantum well structure in which a thick well and a thin well are separated by a thin barrier, but this structure need not be asymmetric. A quantum well comprising another multiple quantum well structure or any other structure can be used provided the structure shows wavelength dependency response shown in FIG. 2.

In the above-described embodiment, the element which exhibits a particular photocurrent response to incident light is employed for light detection. This element can be modified to a transmission type element by removing a part of substrate of the element so as to enable transmission of light, and this modified element can be used as a filter-like element which only shuts off the light of a particular wavelength range.

Next, a light multi-stable element in accordance with a second embodiment of the present invention will be described in detail with reference to the drawings.

Figure 6:
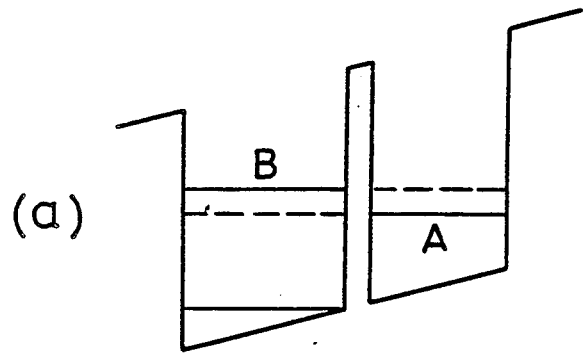
FIGS. 6(a) and 6(b) are diagrams showing the conduction band of a coupled quantum well in accordance with the first and second embodiments of the present invention.
Figure 6:
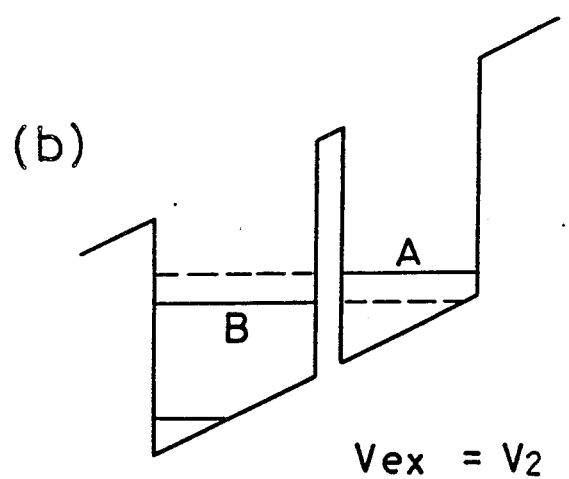

The element of this embodiment has the same general structure as that of FIG. 1. However, in the embodiment of the invention, the GaAs multiple quantum well layer 51 is constructed of a coupled quantum well structure comprising a thick well and a thin well which are separated by a thin barrier. The conduction band structure thereof varies in accordance with the applied voltage $V_{ex}$ from $V_1$ to $V_2$ as shown in FIGS. 6(a) and 6(b).

Figure 7:
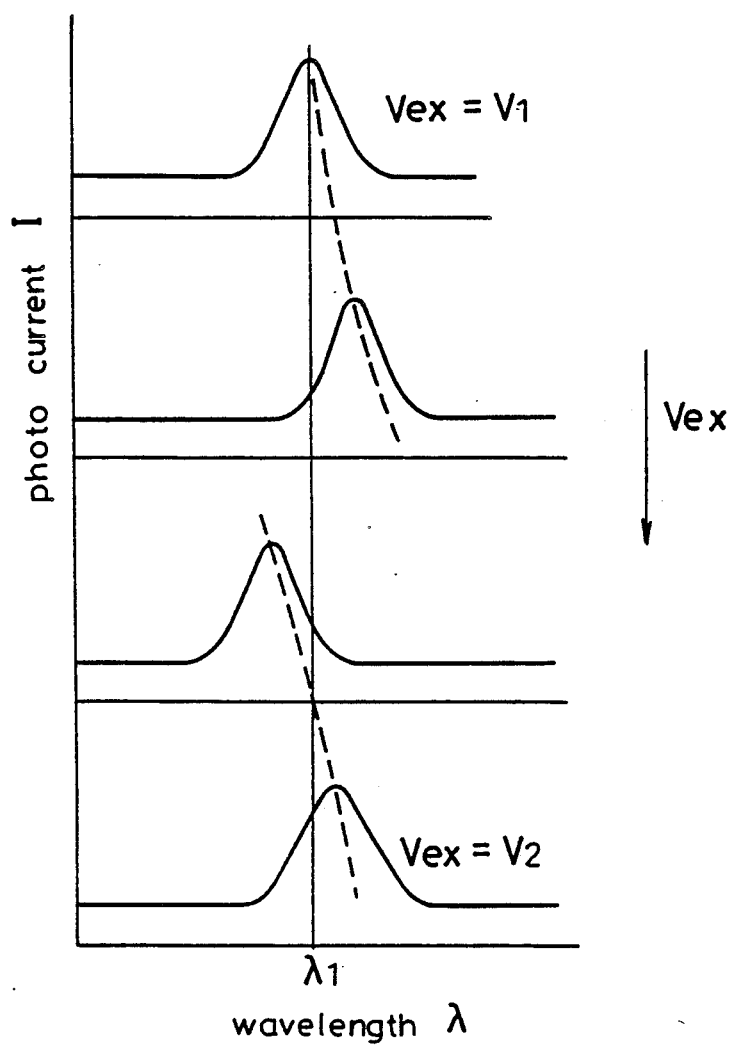
FIG. 7 is a diagram showing the voltage dependency of the photocurrent spectrum in the multi-stable element when the resistor is not connected to the element in accordance with the first and second embodiments of the present invention.

For the applied voltage $V_1$, the quantized level A is lower in energy than B, while for $V_2$ the level B is lower than A. At that time, the strong coupling between wells (by means of a thin barrier layer) makes the levels A and B repel each other. Effected by this, when the voltage is increased from $V_1$ to $V_2$, as shown in FIG. 7, the optical transition relating to, for example, the level A varies discontinuously, which is called the anti-crossing phenomenon.

Figure 8:
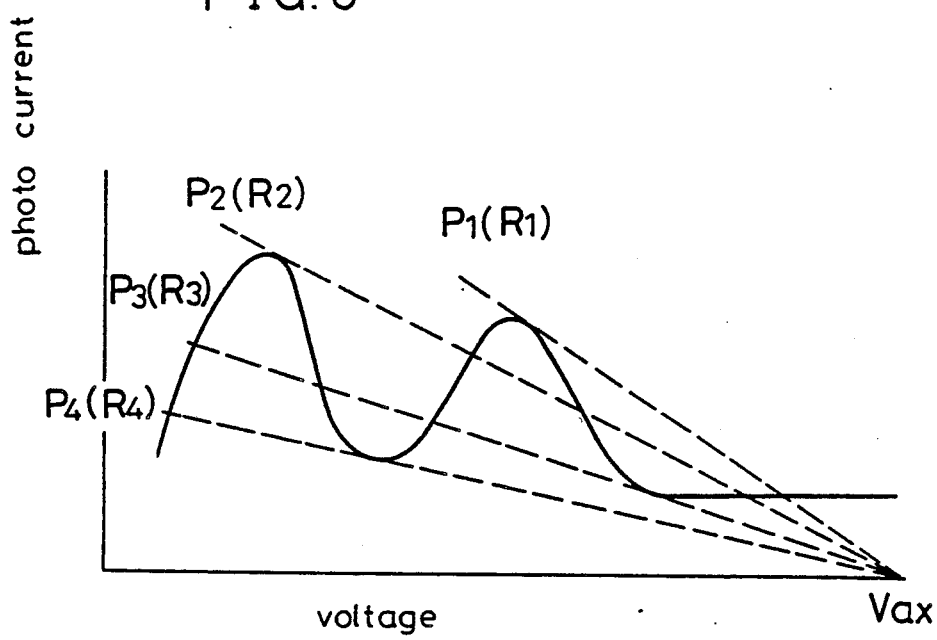
FIG. 8 is a diagram showing the relationship between the photocurrent and the voltage and the load characteristics for four incident light powers (or four resistors) at the wavelength $\lambda = \lambda_1$ from FIG. 7, in a solid curved and broken straight lines, respectively.
Figure 9:
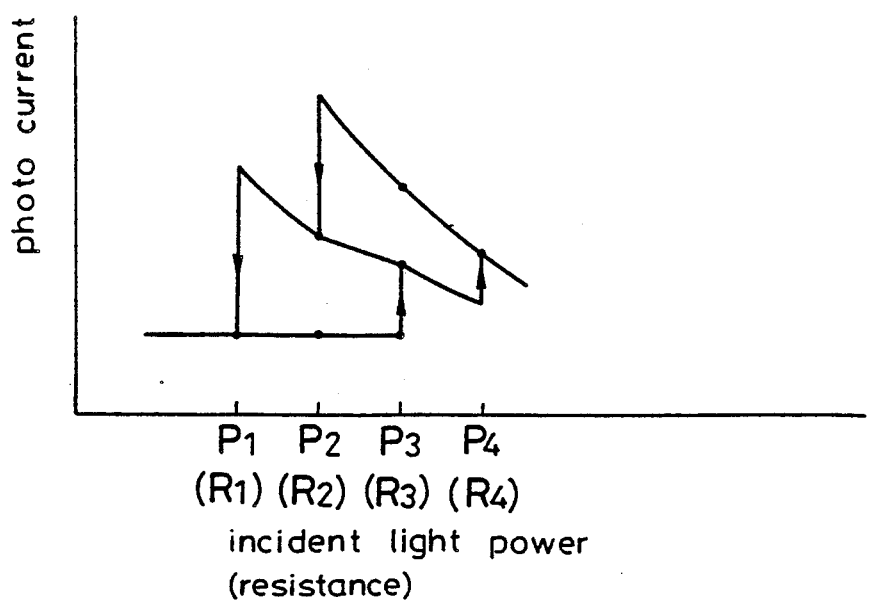
FIG. 9 is a diagram showing the tri-stability for incident light power (or resistor) of the light multi-stable element at the wavelength $\lambda = \lambda_1$ in accordance with the second embodiment of the present invention, which is obtained from the characteristics shown in FIG. 8.
Figure 10:
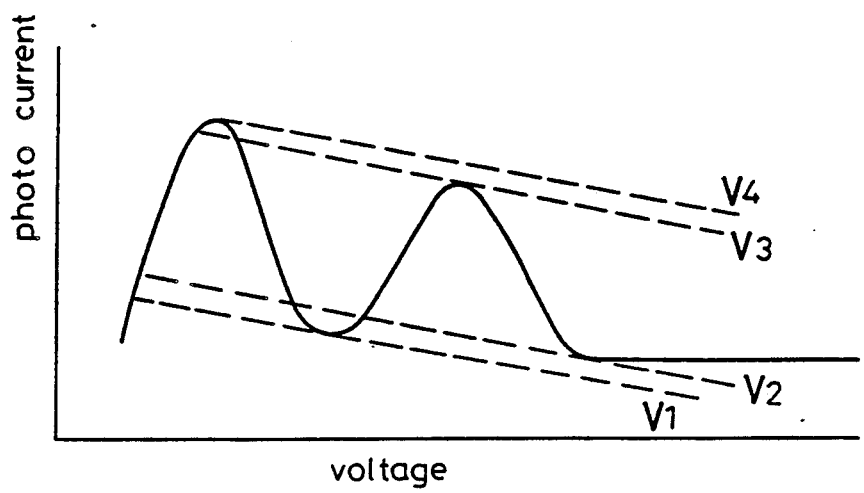
FIG. 10 is a diagram showing the relationship between the photocurrent and the voltage and the load characteristics for four external voltages at the wavelength $\lambda = \lambda_1$ from FIG. 7, in a solid curved and broken straight lines, respectively.
Figure 11:
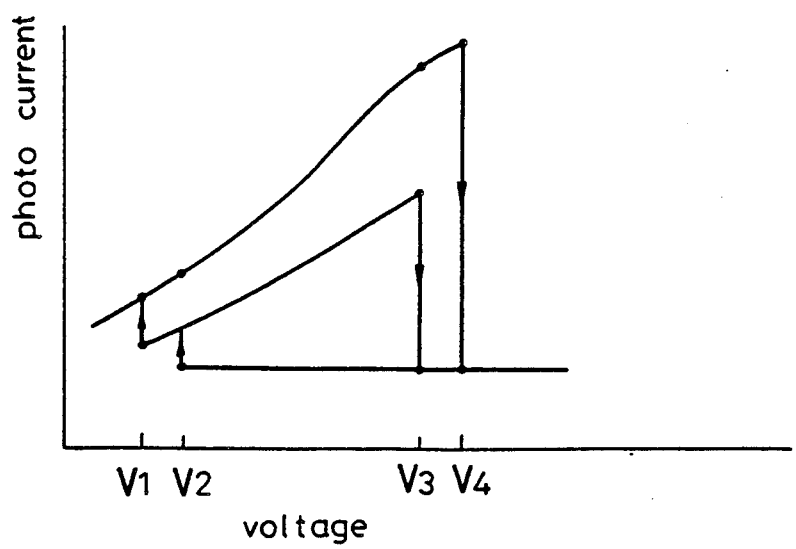
FIG. 11 is a diagram showing the tri-stable property against external voltage of the light multi-stable element at the wavelength $\lambda = \lambda_1$ in accordance with the second embodiment of present invention, which is obtained from the characteristics shown in FIG. 10.
Figure 12:
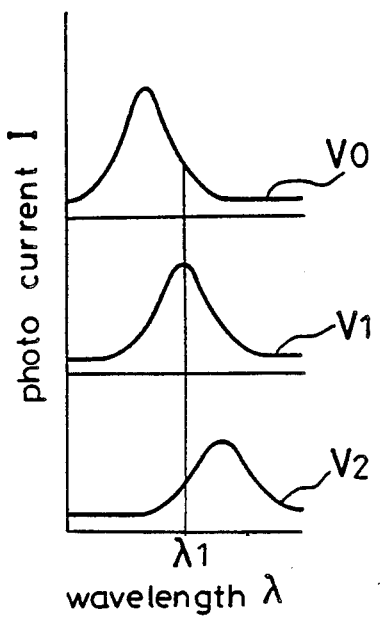
FIG. 12 is a diagram showing the dependency of the photocurrent spectrum on voltage of the prior art light bistable element when the resistor is not connected to the element.
Figure 13:
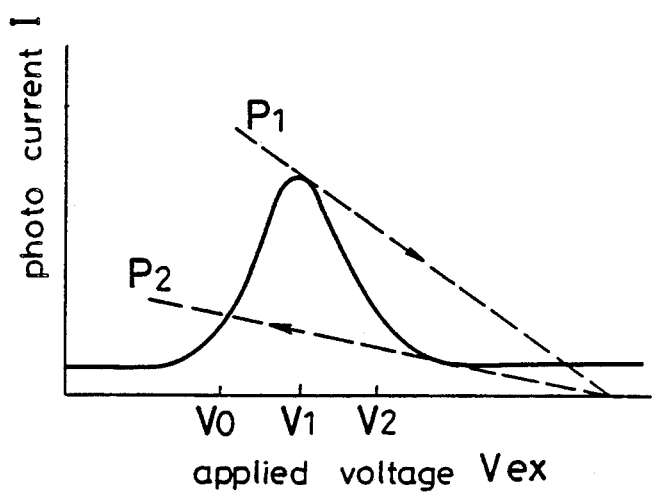
FIG. 13 is a diagram showing the relation between the photocurrent and the voltage and the load characteristics for two incident light powers at the wavelength $\lambda = \lambda_1$ from FIG. 12, in a solid curved and broken straight lines, respectively.
Figure 14:
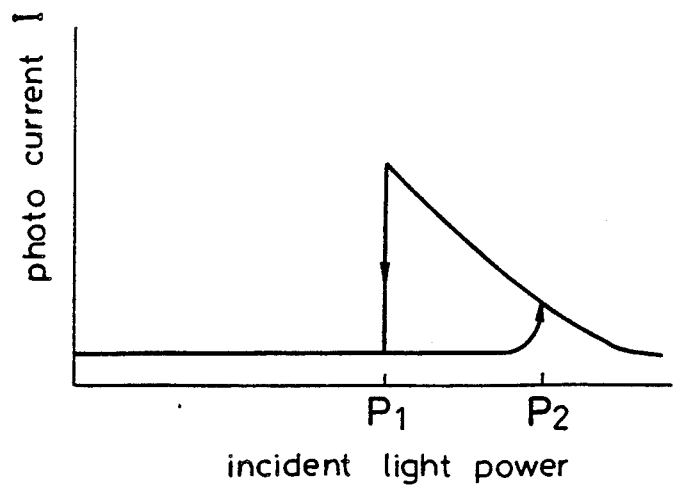
FIG. 14 is a diagram showing the bistability against incident light power of the prior art light bistable element at the wavelength $\lambda = \lambda_1$, which is obtained from the characteristics shown in FIG. 13.

In this embodiment, the relation between the photocurrent and the voltage at the wavelength $\lambda_1$ is represented by the solid curved line of FIG. 8 because of the anti-crossing phenomenon. The intersections between the solid curved line and each broken line representing the load characteristics result in solutions in a circuit in which the external resistor R and the external power supply are provided. FIG. 8 shows the load characteristics for four incident light powers (P1 to P4) or resistors (R1 and R4). The characteristics shown by the FIG. 8 produces the photocurrent response shown in the FIG. 9 as a function of the incident light power (resistor). As shown in FIG. 9, there is obtained a tri-stable range between P2 and P3 (or R2 and R3). Furthermore, with respect to the variation in the applied voltage $V_{ex}$, the characteristics indicated by FIG. 11 can be obtained from FIG. 10 showing voltage-photocurrent characteristics and four load characteristics, in which a tri-stability is obtained in a range between $V_2$ and $V_3$. There can be also obtained a tri-stability at a particular wavelength range.

Although an element showing a tri-stability with respect to photocurrent is shown above, an element showing a tri-stability can be obtained with respect to transmitting light similarly as discussed above.

In the above-described embodiment an element comprising asymmetric double quantum well structure is employed, but the present invention can be generally applied to an element having another structure in which anti-crossing characteristics are obtained with a variable voltage range in the coupled quantum well.

Figure 5:
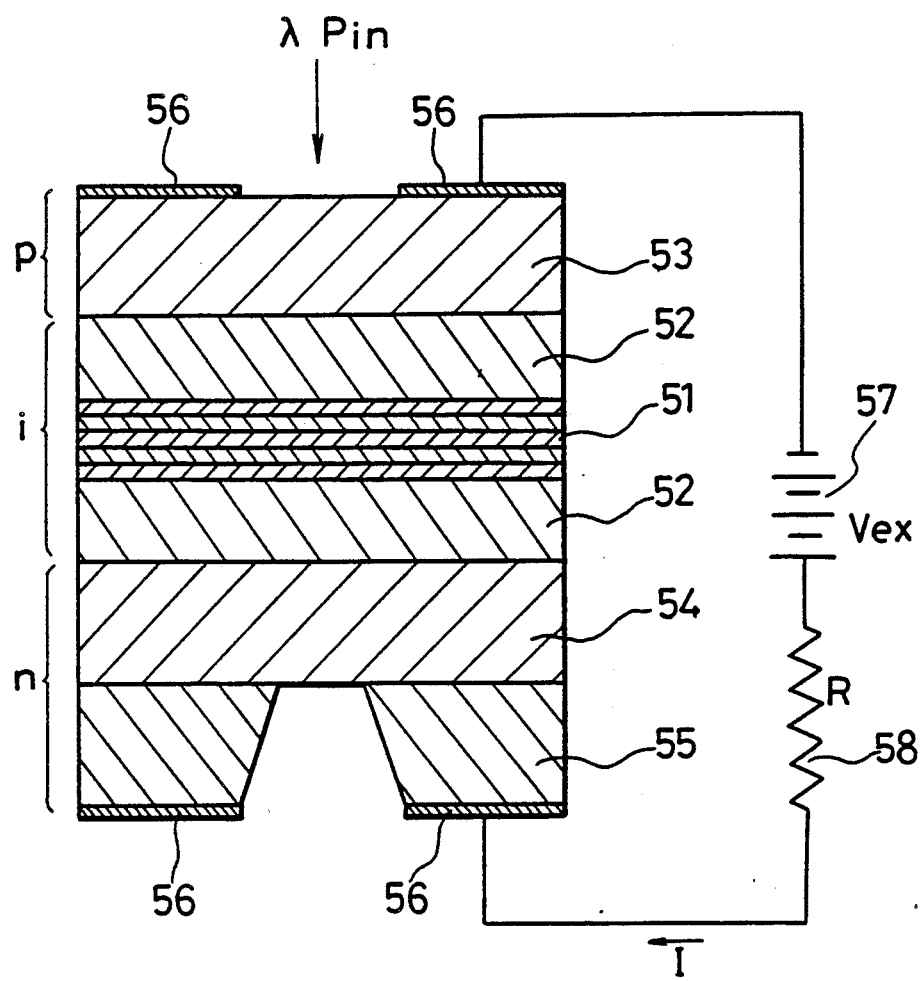
FIG. 5 is a diagram schematically showing a construction of an optical element in accordance with the prior art.

In the above-described embodiment the coupled quantum well structure is used to obtain two peaks shown in FIGS. 8 and 10 produced by an exciton transition crossing, but such a line having two peaks can be obtained by using the heavy-hole exciton and the light-hole exciton in a conventional quantum well structure as shown in FIG. 5.

Furthermore, if a curved line having more than three peaks in the relationship between the photocurrent and the voltage is produced, three or more stable points can be obtained.

I claim:

1. A method of selective light detection comprising:
   providing a p-i-n diode having p-type, intrinsic, and n-type layers including an asymmetrical coupled quantum well structure as the intrinsic layer, said asymmetrical coupled quantum well structure including first and second quantum well layers having a first energy band gap and different thicknesses separated by and quantum mechanically coupled through a barrier layer having a second energy band gap larger than the first energy band gap;
   connecting an external resistor and a voltage power supply in series with said p-i-n diode to apply a reverse bias voltage to said p-i-n diode; and
   selecting at least one of the resistance of the external resistor and the voltage of the voltage power supply to produce three stable photocurrents for light incident on the p-i-n diode.

2. A method of selective light detection comprising:
   providing a p-i-n diode having p-type, intrinsic, and n-type layers including an asymmetrical coupled quantum well structure as the intrinsic layer, said asymmetrical coupled quantum well structure including first and second quantum well layers having a first energy band gap and different thicknesses separated by and quantum mechanically coupled through a barrier layer having a second energy band gap larger than the first energy band gap;
   connecting an external resistor and a voltage power supply in series with said p-i-n diode to apply a reverse bias voltage to said p-i-n diode; and
   selecting at least one of the resistance of the external resistor and the voltage of the voltage power supply to produce three stable photocurrents at each power of light incident on the p-i-n diode within a range of powers of the incident light.

3. A method of selective light detection comprising:
   providing a p-i-n diode having p-type, intrinsic, and n-type layers including an asymmetrical coupled quantum well structure as the intrinsic layer, said asymmetrical coupled quantum well structure including first and second quantum well layers having a first energy band gap and different thicknesses separated by and quantum mechanically coupled through a barrier layer having a second energy band gap larger than the first energy band gap;

connecting an external resistor and a voltage power supply in series with said p-i-n diode to apply a reverse bias voltage to said p-i-n diode; and selecting at least one of the resistance of the external resistor and the voltage of the voltage power supply to produce three stable photocurrents at each wavelength of light incident on the p-i-n diode within a range of wavelengths of the incident light.

* * * * *